(12) United States Patent
Yano

(10) Patent No.: US 8,610,145 B2
(45) Date of Patent: Dec. 17, 2013

(54) LIGHT EMITTING DEVICE

(75) Inventor: Keiichi Yano, Tokyo (JP)

(73) Assignees: Kabushiki Kaisha Toshiba, Tokyo (JP); Toshiba Materials Co., Ltd., Yokohama-shi (JP)

( * ) Notice: Subject to any disclaimer, the term of this patent is extended or adjusted under 35 U.S.C. 154(b) by 753 days.

(21) Appl. No.: 10/572,595

(22) PCT Filed: Sep. 29, 2004

(86) PCT No.: PCT/JP2004/014686
§ 371 (c)(1),
(2), (4) Date: Oct. 24, 2006

(87) PCT Pub. No.: WO2005/031882
PCT Pub. Date: Apr. 7, 2005

(65) Prior Publication Data
US 2007/0200128 A1    Aug. 30, 2007

(30) Foreign Application Priority Data

Sep. 30, 2003  (JP) .................................. 2003-341016

(51) Int. Cl.
*H01L 33/00*    (2010.01)
(52) U.S. Cl.
USPC ............. 257/98; 257/99; 257/778; 257/774; 257/701; 257/E25.032; 257/E33.056; 257/E33.062; 438/106; 438/108; 313/501; 313/512
(58) Field of Classification Search
USPC .................... 257/13, 79, 84, 98, 99, E25.019, 257/E25.032, E33.056–E33.062, 778, 774, 257/701, 702; 438/FOR. 157, FOR. 287, 438/FOR. 453, 106, 108; 313/501, 512
See application file for complete search history.

(56) References Cited

U.S. PATENT DOCUMENTS 4,220,810 A * 9/1980 Arai et al. ...................... 174/263
5,124,234 A   6/1992 Wakata et al.
(Continued)

FOREIGN PATENT DOCUMENTS

DE   199 01 916 A1   8/1999
EP   0 755 074 A2    1/1997
(Continued)

OTHER PUBLICATIONS

U.S. Appl. No. 11/576,533, filed Apr. 3, 2007, Yano.

*Primary Examiner* — Meiya Li
(74) *Attorney, Agent, or Firm* — Oblon, Spivak, McClelland, Maier & Neustadt, L.L.P.

(57) ABSTRACT

A light emitting apparatus 10 includes an aluminum nitride co-fired substrate 11 and a light emitting device 12 arranged on a front surface of the co-fired substrate, in which the front surface of the aluminum nitride substrate 11 bearing the light emitting device 12 is mirror-polished so as to have a surface roughness of 0.3 μm Ra or less, and the light emitting apparatus 10 further includes a vapor-deposited metal film 14 and via holes 15. The vapor-deposited metal film 14 is arranged on the front surface of the aluminum nitride substrate 11 around the light emitting device 12 and has a reflectivity of 90% or more with respect to light emitted from the light emitting device 12. The via holes 15 penetrates the aluminum nitride substrate 11 from the front surface bearing the light emitting device 12 to the rear surface to thereby allow conduction to the light emitting device 12 from the rear surface. This configuration can reduce light emitting apparatuses in size and can provide light emitting apparatuses that are excellent in heat radiation performance, allow a larger current to pass therethrough, and can have a significantly increased luminance with a high luminous efficiency.

9 Claims, 5 Drawing Sheets

(56) References Cited

U.S. PATENT DOCUMENTS

| | | | |
|---|---|---|---|
| 5,770,821 A * | 6/1998 | Hikasa et al. | 174/264 |
| 5,886,401 A * | 3/1999 | Liu | 257/678 |
| 6,184,544 B1 | 2/2001 | Toda et al. | |
| 6,274,924 B1 | 8/2001 | Carey et al. | |
| 6,614,103 B1 * | 9/2003 | Durocher et al. | 257/678 |
| 2002/0102441 A1 * | 8/2002 | Shinosawa et al. | 428/698 |
| 2002/0167017 A1 * | 11/2002 | Nakabayashi et al. | 257/98 |
| 2003/0153108 A1 | 8/2003 | Durocher et al. | |
| 2003/0157437 A1 * | 8/2003 | Yamamoto et al. | 430/311 |
| 2004/0188696 A1 * | 9/2004 | Hsing Chen et al. | 257/99 |
| 2004/0262738 A1 * | 12/2004 | Lee et al. | 257/700 |

FOREIGN PATENT DOCUMENTS

| | | |
|---|---|---|
| EP | 1 059 667 | 12/2000 |
| JP | 62-128576 | 6/1987 |
| JP | 2-190859 | 7/1990 |
| JP | 09-293904 | 11/1997 |
| JP | 9-293904 | 11/1997 |
| JP | 10-215001 | 8/1998 |
| JP | 10-279377 | 10/1998 |
| JP | 2001-338505 | 12/2001 |
| JP | 2002-203989 | 7/2002 |
| JP | 2003-23183 | 1/2003 |

* cited by examiner

LIGHT EMITTING DEVICE

TECHNICAL FIELD

The present invention relates to light emitting apparatuses including light emitting devices such as light emitting diodes (LEDs) arranged on surfaces of insulating substrates. More specifically, it relates to light emitting apparatuses that can be reduced in size, are excellent in heat radiation performance, allow a larger current to pass therethrough, and can have a significantly increased luminance with a high luminous efficiency.

BACKGROUND ART

Light emitting diodes (hereinafter also referred to as LED chips) are light emitting devices (light emitting elements) that act as light sources upon application of a voltage and utilize light emitted as a result of recombination between electrons and positive holes in the vicinity of a contact surface (pn-junction) between two semiconductors. These light emitting devices are small in size and have a high conversion efficiency of electric energy into light, and therefore are widely used as household electrical appliances, lighted operation switches, and LED indicators (LED displays).

Differing from electric lamp bulbs using filaments, the light emitting diodes are semiconductor devices, are thereby free from blowout, are excellent in initial drive performance, and have excellent durability even under vibrations and/or repeated ON/OFF operations. They are therefore also used as backlights of indicators or displays typically for automobile dashboards. Particularly, since they can emit light of a clear color with high color saturation without being affected by sunlight, the uses of the light emitting diodes will be expanded even to, for example, displays arranged outdoor, displays for traffic use, and traffic signals, or the like.

As conventional light emitting apparatuses bearing light emitting devices such as LED chips, for example, there is proposed a light emitting apparatus shown in FIG. 4 (see, for example, Patent Document (Japanese Unexamined Patent Application Publication No. 10-215001)). The light emitting apparatus 1 comprises a ceramic package 3, a LED chip as a light emitting device, a first metal layer 6, a second metal layer 7, and a resin molding 8. The ceramic package 3 includes conductive interconnections 2 and has a concave opening. The LED chip 5 is electrically connected to the conductive interconnections 2 via bonding wires 4 in the concave opening. The first metal layer 6 and the second metal layer 7 are arranged on side walls of the concave opening. The resin molding 8 seals the concave opening.

The patent document mentions that, according to the conventional light emitting device, the first metal layer 6 arranged in the concave opening acts to increase the adhesion with the ceramic package 3, and, additionally, the second metal layer 7 acts to reflect light emitted from the LED chip 5, the light loss can thereby be reduced and the contrast typically in displays can be increased.

The conventional light emitting apparatus, however, has a fatal defect of very poor heat radiation performance, since the ceramic package bearing the LED chip comprises a ceramic material mainly containing alumina ($Al_2O_3$) and having a low thermal conductivity, and the molding resin for sealing the LED chip also has a low thermal conductivity. The LED chip may be broken due to heat generated upon application of a high voltage and/or a large current. Consequently, the conventional light emitting apparatus has a low luminance, since the highest voltage that can be applied to the LED chip is low and the current to be supplied is limited to several ten milliamperes.

Since only a low luminance is required, the conventional light emitting apparatus using a LED chip has been practically used without significant problems even at the above-mentioned current quantity. With recent expanding specific uses of LED light emitting apparatuses, however, technical demands have been made to achieve structures that can increase the current to be passed to about several amperes at a higher power and can thereby increase the luminance.

Additionally, in conventional light emitting apparatuses as shown in FIG. 4, the LED chip and the conductive interconnections are electrically connected by a wire bonding process, so that a portion where the bonding wire rises protrudes in a thickness direction of the apparatus, and a large electrode region for connecting the edge of the bonding wire is disadvantageously required. Thus, there has been posed a problem that the LED package including the interconnection structure becomes large in size.

Furthermore, when the LED chip is mounted and housed in a concave opening as shown in FIG. 4 so as to avoid the adverse influence of the bonding wire protruding in a thickness direction of the apparatus, the light emitted from the LED chip is absorbed by the inner wall of the concave opening to increase the light loss and thereby to decrease the luminous efficiency. Thus, according to the conventional technique, a metal layer that reflects light is arranged on the inner wall of the concave opening to thereby reduce the absorption loss of light. However, it is very difficult to form such a reflecting metal layer uniformly in the concave opening having a curved inner wall, and the emitted light is partially absorbed by the inner wall to invite light loss. In addition, there has been also posed another problem that the inner wall of the concave opening itself has such a structure as to inhibit the travel or transmission of the light, and the luminance is thereby decreased.

The present invention has been achieved to solve the conventional problems, and an object of the present invention is to provide a light emitting apparatus that can be reduced in size, is excellent in heat radiation performance, allows a larger current to pass therethrough, and can have a significantly increased luminance with a high luminous efficiency.

DISCLOSURE OF INVENTION

To achieve the above object, the present invention provides a light emitting apparatus comprising an aluminum nitride co-fired substrate and a light emitting device arranged on a front surface of the co-fired substrate, wherein the front surface of the aluminum nitride substrate, on which the light emitting device is arranged, is mirror-polished so as to have a surface roughness of 0.3 μm Ra or less, and the light emitting apparatus further comprises a vapor-deposited metal film and via holes, the vapor-deposited metal film being arranged on the front surface of the aluminum nitride substrate around the light emitting device and having a reflectivity of 90% or more with respect to light emitted from the light emitting device, and the via holes penetrating the aluminum nitride substrate from the front surface, on which the light emitting device is arranged, to the rear surface of the substrate to thereby allow conduction to the light emitting device from the rear surface.

In the light emitting apparatus, the vapor-deposited metal film preferably comprises aluminum (Al) or silver (Ag). The light emitting apparatus preferably comprises a LED chip as the light emitting device and further comprises at least one peripheral component arranged and mounted on the aluminum nitride substrate. The peripheral component is selected from the group consisting of diodes for inhibiting reverse current, resistances, and thermistors.

In the light emitting apparatus, it is more preferable that the aluminum nitride substrate bearing and mounting the light emitting device has a surface roughness of 0.1 μm Ra or less.

The light emitting device in the light emitting apparatus is preferably mounted on the aluminum nitride substrate by a flip chip technique.

Specifically, the light emitting apparatus according to the present invention uses an aluminum nitride (AlN) co-fired substrate having a high thermal conductivity as a ceramic substrate (LED package) for mounting a LED chip. In particular, by using an aluminum nitride substrate having a high thermal conductivity, the light emitting apparatus can have a significantly increased heat radiation performance and an increased critical current quantity, thereby allows a large current to pass therethrough, and can thereby have a significantly increased luminance.

Since the surface of the ceramic substrate (AlN substrate) bearing the light emitting device is mirror-polished, the reflectivity at the polished surface increases, and light emitted from the joint surface of the light emitting device can be effectively reflected toward the front surface of the substrate. Thus, the emission intensity (luminance) can be substantially increased. The surface roughness of the mirror-polished surface is set at 0.3 μm Ra or less in terms of the arithmetic average roughness (Ra) specified in Japanese Industrial Standards (JIS B 0601). If the surface is roughened so as to have a surface roughness exceeding 0.3 μm Ra, irregular reflection and/or absorption of emitted light on the polished surface tends to occur, and the emission intensity tends to decrease. The surface roughness of the mirror-polished surface is therefore set at 0.3 μm Ra or less. By setting the surface roughness at 0.1 μm Ra or less, the reflectivity of emitted light can further be increased.

Additionally, by arranging a vapor-deposited metal film, which has a reflectivity of 90% or more with respect to light emitted from the light emitting device, on the front surface of the aluminum nitride substrate around the light emitting device, the light emitted from the rear surface of the light emitting device can be effectively reflected by the vapor-deposited metal film and be directed to the front surface of the substrate, and the emission intensity (luminance) toward the front surface of the substrate can further be increased. The vapor-deposited metal film having a reflectivity of 90% or more preferably comprises aluminum (Al) or silver (Ag). The vapor-deposited metal film may be formed so as to have a thickness of about 1 to 5 μm typically by chemical vapor deposition (CVD) method or sputtering method. The above reflectivity is given as the ratio of the emission intensity of the reflected light to the emission intensity of the incident light.

Since via holes are arranged which penetrates the aluminum nitride substrate from the front surface bearing the light emitting device to the rear surface so as to allow conduction to the light emitting device from the rear surface, a current is allowed to pass from the rear surface of the aluminum nitride substrate via the via holes to the light emitting device on the front surface. This structure eliminates the necessity of connection of interconnections on the front surface of the substrate by a wire bonding process, simplifies the interconnection structure, avoids the protrusion of bonding wires in a thickness direction of the light emitting apparatus, and the light emitting apparatus can thereby be reduced in thickness and size.

In addition, the component package density on the front surface of the substrate can be increased and the light emitting apparatus can further be reduced in size by allowing the light emitting apparatus to comprise a LED chip as the light emitting device and further comprise at least one peripheral component being arranged on the aluminum nitride substrate and selected from the group consisting of diodes for inhibiting reverse current, resistances, and thermistors.

Since via holes are arranged in the light emitting apparatus so as to penetrate the aluminum nitride substrate from the front surface bearing the light emitting device to the rear surface thereof to thereby allow conduction to the light emitting device from the rear surface, the light emitting device can be mounted to the aluminum nitride substrate by a flip chip assembly technique. Specifically, interconnection (wiring) can be conducted in accordance with a face down system, in which metal bumps such as solder bumps are formed on connection ends of the light emitting device such as a LED chip, and the bumps are connected to an energizing interconnection arranged on the rear surface of the substrate via the via holes and lands arranged on ends of interconnecting conductors. According to the interconnection structure by the face down system, electrodes can be taken out at arbitrary positions of the surface of the light emitting device. This structure allows the connection between the light emitting device and the interconnection conductor at a shortest distance, inhibits the LED chip as the light emitting device from increasing in size even with an increased number of electrodes, and enables the mounting of the LED chip in a vary small thickness.

In the light emitting apparatus, a white resist film is preferably arranged on an exposed surface of the aluminum nitride substrate other than the region where the vapor-deposited metal film is arranged.

The vapor-deposited metal film carries out the function of effectively reflecting light emitted from the light emitting device and acts also as a conductive layer for energizing the light emitting device. Accordingly, a gap free from vapor-deposited metal film is inevitably present between the traces for conductive layers directly below the light emitting device so as to partition positive and negative conductive layers. In general, the area of the region where the vapor-deposited metal film is arranged is smaller than the surface area of the aluminum nitride substrate. This structure inevitably yields a region where no vapor-deposited metal film is arranged, namely, a region where the aluminum nitride substrate is exposed, in the periphery of the aluminum nitride substrate. When the light emitting device is allowed to emit light under this condition, the emitted light dissipates from the region where no vapor-deposited metal film is arranged and/or the gap via the aluminum nitride substrate to the rear surface at an increased rate, and the intensity of light emitted toward the front surface is decreased. This tendency becomes more remarkable when the purity of the aluminum nitride substrate is increased so as to increase the thermal conductivity thereof, because the transparency of the aluminum nitride substrate increases with an increasing purity thereof.

However, by arranging a white resist film on an exposed front surface of the aluminum nitride substrate other than the region where the vapor-deposited metal film is arranged, the light emitted from the light emitting device can be effectively prevented from dissipating through the aluminum nitride substrate, and the luminance can be increased. For increasing the reflectivity of emitted light, the color of the resist film must be white.

The resist film in the light emitting apparatus preferably comprises a solder resist ink and is formed by screen printing. The solder resist ink is a thermostable covering member to be applied to specific regions of, for example, printed wiring boards and acts as a cladding material so as to prevent the solder from deposition in regions other than the region where solder bumps or the like are formed.

Consequently, by forming the resist film from a solder resist ink, a short circuit between the traces for conductive layers due to spreading of bumps connecting the flip chip can be effectively prevented. Additionally, the resist film comprising a solder resist ink can be efficiently formed by screen printing method.

BEST MODE FOR CARRYING OUT THE INVENTION

Next, embodiments of the light emitting apparatuses according to the present invention will be explained and illustrated in more detail with reference to the attached drawings.

Examples 1 to 24 and Comparative Examples 1 to 11

A multitude of aluminum nitride (AlN) substrates, epoxy resin substrates, and alumina ($Al_2O_3$) substrates having the thickness and thermal conductivities shown in Table 1 were prepared as substrates for examples and comparative examples. The aluminum nitride (AlN) substrates for the examples and the alumina ($Al_2O_3$) substrates for the comparative examples were produced by co-firing and have via holes penetrating the substrates in a thickness direction, and lands are formed on ends of the via holes on the rear surface of the substrates. The lands serve as terminal conductors for connecting leads of components.

Next, the front surfaces of the aluminum nitride (AlN) substrates and the alumina ($Al_2O_3$) substrates where LED chips as light emitting devices are to be mounted were subjected to mirror polishing so as to have surface roughness of 0.1 to 0.3 μm Ra shown in Table 1. Metal deposition films comprising silver (Ag) or aluminum (Al) were deposited by chemical vapor deposition (CVD) method to thickness shown in Table 1 on front surfaces of the substrates to be around the LED chips as the light emitting devices.

On the other hand, in COMPARATIVE EXAMPLE 1, an epoxy resin substrate was used, and the vapor-deposited metal film was not formed. In COMPARATIVE EXAMPLES 2 and 3, vapor-deposited metal films comprising Ag or Al were formed on front surfaces of alumina ($Al_2O_3$) substrates having a low thermal conductivity around the region where the chips were to be mounted. The light emitting apparatuses according to COMPARATIVE EXAMPLES 4 to 11 were produced by the same procedure as in EXAMPLE 1, except that the surfaces on which the LED chips were to be mounted had surface roughness greater than the level specified in the present invention as a result of polishing them lightly to such an extent as to remove deposits remained on front surfaces of the substrates after sintering.

Blue LED chips having the same specifications were mounted on front surfaces of the respective substrates, energizing terminals were connected to lands on the rear surfaces (backsides) of the substrates, and interconnections were connected so as to energize the LED chips through via holes. Finally, yellow phosphors (YAG) were mounted so as to cover the mounted LED chips. Thus, light emitting apparatuses according to the examples and comparative examples which emit white light were produced.

Figure 1:
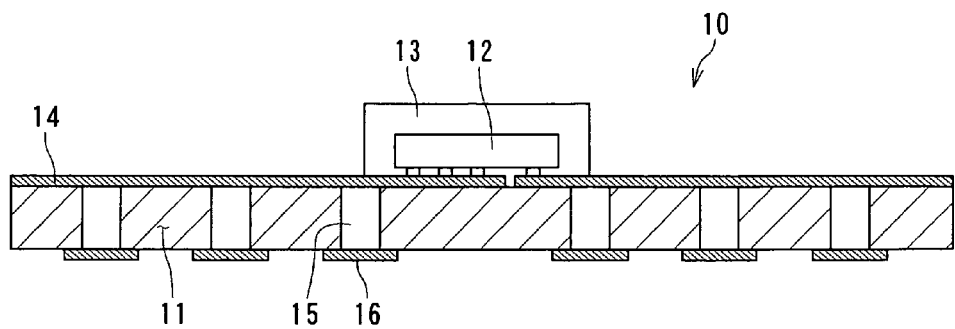
FIG. 1 is a sectional view showing an embodiment of the light emitting apparatuses according to the present invention.
Figure 2:
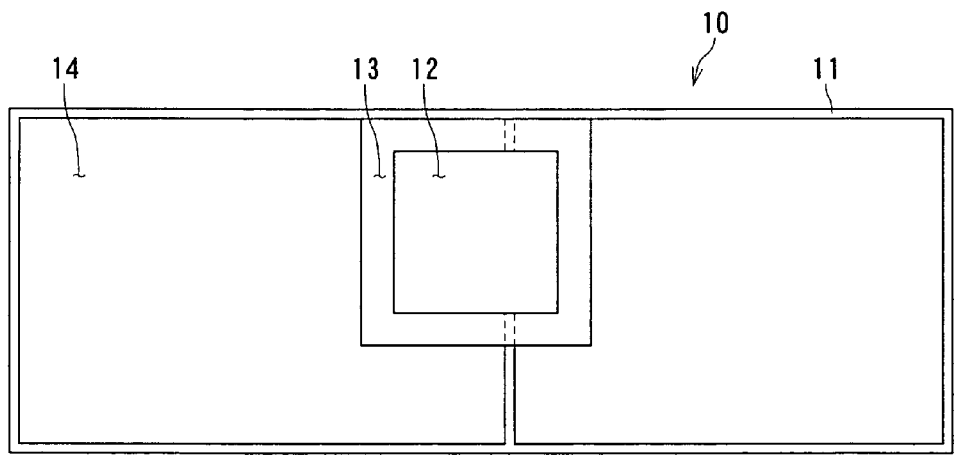
FIG. 2 is a plan view of the light emitting apparatus shown in FIG. 1.

Each of the thus-prepared light emitting apparatuses 10 according to the examples structurally includes, as shown in FIGS. 1 and 2, an aluminum nitride (AlN) substrate 11 having a high thermal conductivity; a blue LED chip 12 mounted on the front surface of the AlN substrate 11; a yellow phosphor 13 arranged so as to cover the surface of the LED chip 12; a vapor-deposited metal film 14 arranged on the front surface of the AlN substrate 11; via holes 15 arranged so as to penetrate the AlN substrate 11 in a thickness direction; and lands 16 arranged on ends of the via holes 15 on the rear surface of the substrate. Energizing terminals are connected to the lands 16 on the rear surface (backside) of the AlN substrate 11, and interconnections are connected so as to energize the LED chip 12 through the via holes 15.

Regarding the thus-prepared light emitting apparatuses according to the examples and comparative examples, the specifications (type of material, thickness, and thermal conductivity) of the respective substrates, the surface roughness of the side on which the LED chip is mounted, and the specifications of the vapor-deposited metal film (type, thickness, and optical reflectivity) are shown in Table 1. Additionally, the maximum current quantity within a range where the LED chip stably emits light without breakage was determined while the quantity of current to be fed and applied to each of the LED chips was gradually increased. The maximum emission intensities of the respective light emitting apparatuses were determined. The results are shown in Table 1. The emission intensities are relatively indicated whereas the emission intensity of the light emitting apparatus according to COMPARATIVE EXAMPLE 2 using an alumina ($Al_2O_3$) substrate is set at 100% (standard value).

TABLE 1

| Sample No. | Substrate Material | Substrate Thickness (mm) | Substrate Thermal Conductivity (W/m·K) | Surface Roughness of LED Mounting Surface (μm) | Vapor-Deposited Metal Film Type | Vapor-Deposited Metal Film Thickness (μm) | Vapor-Deposited Metal Film Optical Reflectivity (%) | Applicable Maximum Current Quantity (mA) | Light Emitting Intensity (Relative Value) (%) |
|---|---|---|---|---|---|---|---|---|---|
| EXAMPLE 1 | AlN | 0.6 | 180 | 0.1 | Ag | 3 | 95 | 1300 | 300 |
| EXAMPLE 2 | AlN | 0.6 | 180 | 0.1 | Al | 3 | 92 | 1300 | 280 |
| EXAMPLE 3 | AlN | 0.6 | 180 | 0.2 | Ag | 3 | 95 | 1300 | 300 |
| EXAMPLE 4 | AlN | 0.6 | 180 | 0.2 | Al | 3 | 92 | 1300 | 280 |
| EXAMPLE 5 | AlN | 0.6 | 180 | 0.3 | Ag | 3 | 95 | 1300 | 290 |
| EXAMPLE 6 | AlN | 0.6 | 180 | 0.3 | Al | 3 | 92 | 1300 | 270 |
| EXAMPLE 7 | AlN | 0.3 | 180 | 0.1 | Ag | 3 | 95 | 1100 | 295 |
| EXAMPLE 8 | AlN | 0.3 | 180 | 0.1 | Al | 3 | 92 | 1100 | 275 |
| EXAMPLE 9 | AlN | 0.3 | 180 | 0.2 | Ag | 3 | 95 | 1100 | 295 |
| EXAMPLE 10 | AlN | 0.3 | 180 | 0.2 | Al | 3 | 92 | 1100 | 275 |
| EXAMPLE 11 | AlN | 0.3 | 180 | 0.3 | Ag | 3 | 95 | 1100 | 285 |
| EXAMPLE 12 | AlN | 0.3 | 180 | 0.3 | Al | 3 | 92 | 1100 | 265 |
| EXAMPLE 13 | AlN | 0.6 | 200 | 0.1 | Ag | 3 | 95 | 2000 | 380 |
| EXAMPLE 14 | AlN | 0.6 | 200 | 0.1 | Al | 3 | 92 | 2000 | 360 |
| EXAMPLE 15 | AlN | 0.6 | 200 | 0.2 | Ag | 3 | 95 | 2000 | 380 |
| EXAMPLE 16 | AlN | 0.6 | 200 | 0.2 | Al | 3 | 92 | 2000 | 360 |
| EXAMPLE 17 | AlN | 0.6 | 200 | 0.3 | Ag | 3 | 95 | 2000 | 370 |
| EXAMPLE 18 | AlN | 0.6 | 200 | 0.3 | Al | 3 | 92 | 2000 | 350 |
| EXAMPLE 19 | AlN | 0.3 | 200 | 0.1 | Ag | 3 | 95 | 1800 | 375 |
| EXAMPLE 20 | AlN | 0.3 | 200 | 0.1 | Al | 3 | 92 | 1800 | 355 |
| EXAMPLE 21 | AlN | 0.3 | 200 | 0.2 | Ag | 3 | 95 | 1800 | 375 |
| EXAMPLE 22 | AlN | 0.3 | 200 | 0.2 | Al | 3 | 92 | 1800 | 355 |
| EXAMPLE 23 | AlN | 0.3 | 200 | 0.3 | Ag | 3 | 95 | 1800 | 365 |
| EXAMPLE 24 | AlN | 0.3 | 200 | 0.3 | Al | 3 | 92 | 1800 | 345 |
| C. EXAMPLE 1 | resin | 0.6 | 0.2 | 0.2 | — | — | 80 | 20 | 10 |
| C. EXAMPLE 2 | alumina | 0.6 | 16 | 0.2 | Ag | 3 | 95 | 350 | 100 |
| C. EXAMPLE 3 | alumina | 0.6 | 16 | 0.2 | Al | 3 | 92 | 350 | 90 |
| C. EXAMPLE 4 | AlN | 0.6 | 180 | 0.6 | Ag | 3 | 93 | 1300 | 250 |
| C. EXAMPLE 5 | AlN | 0.6 | 180 | 0.6 | Al | 3 | 91 | 1300 | 230 |
| C. EXAMPLE 6 | AlN | 0.3 | 180 | 0.6 | Ag | 3 | 93 | 1100 | 245 |
| C. EXAMPLE 7 | AlN | 0.3 | 180 | 0.6 | Al | 3 | 91 | 1100 | 225 |
| C. EXAMPLE 8 | AlN | 0.6 | 200 | 0.6 | Ag | 3 | 93 | 2000 | 330 |
| C. EXAMPLE 9 | AlN | 0.6 | 200 | 0.6 | Al | 3 | 91 | 2000 | 310 |
| C. EXAMPLE 10 | AlN | 0.3 | 200 | 0.6 | Ag | 3 | 93 | 1800 | 325 |
| C. EXAMPLE 11 | AlN | 0.3 | 200 | 0.6 | Al | 3 | 91 | 1800 | 305 |

C. EXAMPLE denotes COMPARATIVE EXAMPLE

As is obvious from the results shown in Table 1, the light emitting apparatuses according to the examples have improved heat radiation performance and can thereby have significantly increased critical currents (maximum passable current, or applicable maximum current quantity) and dramatically increased emission intensities, which light emitting apparatuses each use an aluminum nitride (AlN) substrate 11 having a high thermal conductivity, have a mirror-polished surface as the LED chip-mounted surface, and comprise a specific vapor-deposited metal film on the surface of the AlN substrate 11.

In contrast, the results reaffirm that the light emitting apparatuses according to COMPARATIVE EXAMPLES 1 to 3 using an epoxy resin substrate or an alumina (Al$_2$O$_3$) substrate having low thermal conductivities are limited in power that can be supplied to the apparatuses due to their poor thermal radiation performance, have a relatively low critical current and are not expected to be improved in emission intensity. In the light emitting apparatuses according to COMPARATIVE EXAMPLE 4 to 11 which use AlN substrates but have excessively great surface roughness of the LED chip-mounted surface, the irregular reflection and absorption of light at the joint surface of the chip increase to thereby increase the rate of emitted light to be absorbed by the AlN substrate, although large quantities of current can be supplied to these apparatuses. Thus, they have decreased emission intensities.

Figure 3:
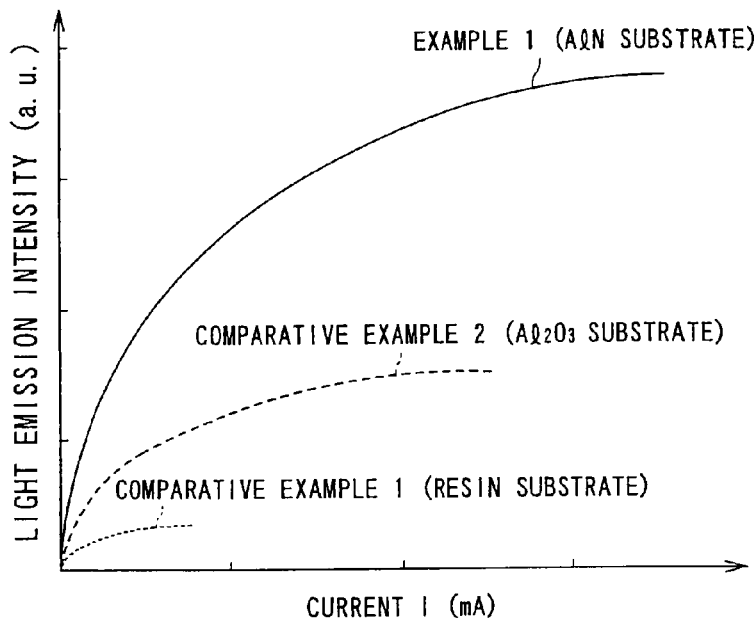
FIG. 3 is a graph showing the relationship between the current and the light emission intensity in light emitting apparatuses according to EXAMPLE 1 and COMPARATIVE EXAMPLES 1 and 2.
Figure 4:
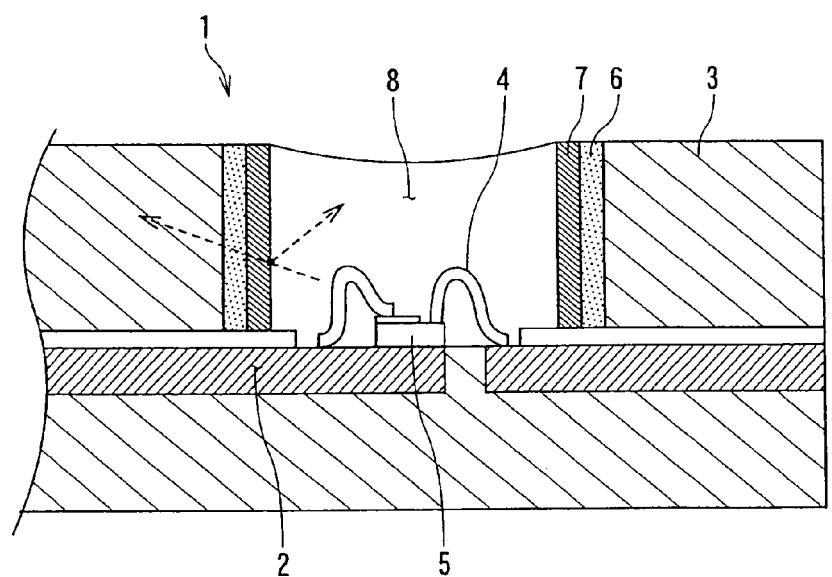
FIG. 4 is a sectional view showing an example of the configurations of conventional light emitting apparatuses.

FIG. 3 is a graph showing the relationship between the current and the light emission intensity in light emitting apparatuses according to EXAMPLE 1 and COMPARATIVE EXAMPLES 1 and 2. The light emitting apparatus according to EXAMPLE 1 using an aluminum nitride (AlN) substrate 11 as a substrate on which the LED chip 12 is mounted can be significantly increased in critical current and can be dramatically increased in luminance, as compared with the light emitting apparatuses according to COMPARATIVE EXAMPLES 1 and 2 using a resin substrate or an alumina (Al$_2$O$_3$) substrate.

The light emitting apparatus 10 according to the respective examples uses an aluminum nitride (AlN) co-fired substrate 11 having a high thermal conductivity as a substrate (LED package) for mounting the blue LED chip 12. Thus, the heat radiation performance of the light emitting apparatus 10 significantly increases, so that the critical current (applicable maximum current quantity) increases thereby to allow a large current to pass, and the luminance can be significantly increased.

Since the surface of the AlN substrate 11, on which the blue LED chip 12 as the light emitting device is mounted, is mirror-polished, the reflectivity at the polished surface increases, and light emitted from the joint surface of the LED chip 12 can be effectively reflected toward the front surface of the substrate. Thus, the emission intensity (luminance) can be substantially increased.

Since the via holes 15 are arranged so as to penetrate the aluminum nitride substrate 11 from the front surface bearing the LED chip 12 to the rear surface to thereby allow conduction to the LED chip 12 from the rear surface, the current is allowed to pass from the rear surface of the aluminum nitride substrate 11 via the via holes 15 to the LED chip 12 on the front surface. This structure eliminates the necessity of connection of interconnections on the front surface of the substrate 11 by a wire bonding process, simplifies the interconnection structure, avoids the protrusion of bonding wires in a thickness direction, and can reduce the light emitting apparatus 10 in thickness and size.

Since the via holes 15 are arranged so as to penetrate the aluminum nitride substrate 11 from the front surface to the rear surface thereof to thereby allow conduction to the LED chip 12 from the rear surface, the LED chip 12 can be interconnected by a flip chip assembly technique in accordance with a face down system. The interconnection structure according to the face down system enable electrodes to be taken out at arbitrary positions of the surface of the LED chip 12. This allows the connection between the LED chip 12 and the interconnection conductor at a shortest distance, inhibits the LED chip as the light emitting device from increasing in size even an increased number of electrodes, and enables the mounting of the LED chip in a vary small thickness.

Next, an embodiment of light emitting apparatuses in which a white resist film is arranged to a portion where the surface of the aluminum nitride substrate is exposed, such as a portion between the trances (wiring patterns) for conductive layers, other than the region bearing the vapor-deposited metal film will be described.

Example 25

Figure 5A:
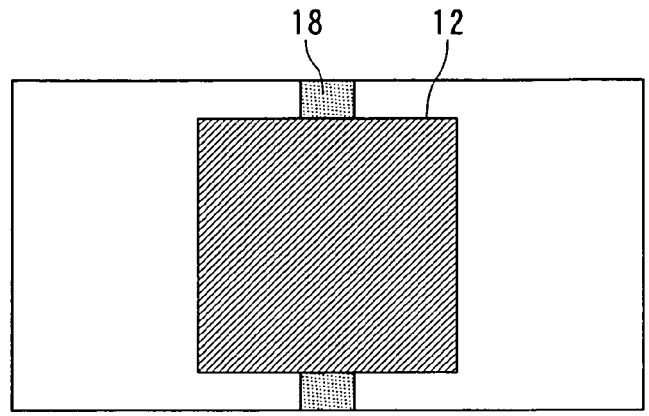
FIGS. 5A and 5B are a plan view and a sectional view, respectively, of an example of the configurations of light emitting apparatuses having a resist film.
Figure 5B:
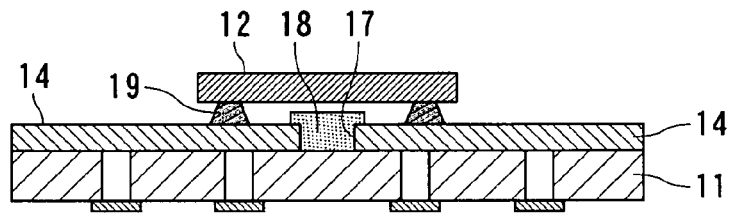

As is shown in FIGS. 5A and 5B, a white resist film 18 was formed by applying, by screen printing, a white solder resist ink to a gap (gap between traces) 17 between vapor-deposited metal films 14 and 14 to be conductive layers in the light emitting apparatus prepared in EXAMPLE 1. Then, a LED chip 12 as a light emitting 15 device was mounted and fixed on the vapor-deposited metal films 14 via flip chip bumps 19 to thereby yield a light emitting apparatus according to EXAMPLE 25.

Comparative Example 12

Figure 6A:
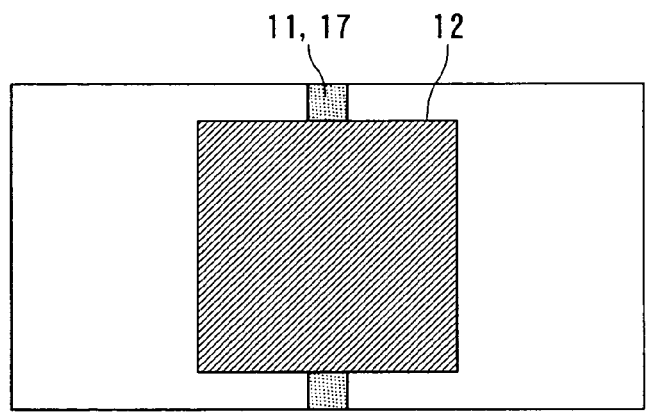
FIGS. 6A and 6B are a plan view and a sectional view, respectively, of an example of the configurations of light emitting apparatuses having no resist film.
Figure 6B:
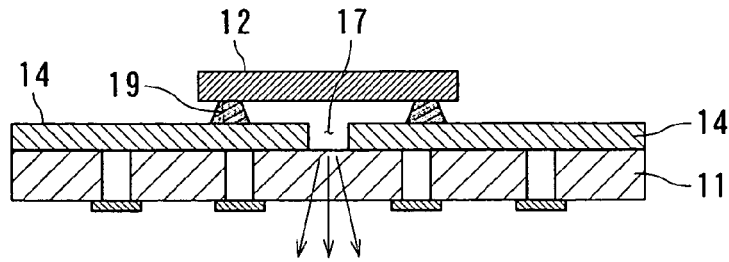

The procedure of EXAMPLE 25 was repeated, except that the white resist film was not formed in the gap 17 between the vapor-deposited metal films 14 and 14, as 20 illustrated in FIGS. 6A and 6B. Then, a LED chip 12 as a light emitting device was mounted and fixed on the vapor-deposited metal films 14 via flip chip bumps 19 to thereby yield a light emitting apparatus according to COMPARATIVE EXAMPLE 12.

The changes in luminance with time of the thus-prepared light emitting apparatuses according to EXAMPLE 25 and COMPARATIVE EXAMPLE 12 were determined while gradually increasing the current to pass therethrough. The results are shown in FIG. 7.

Figure 7:
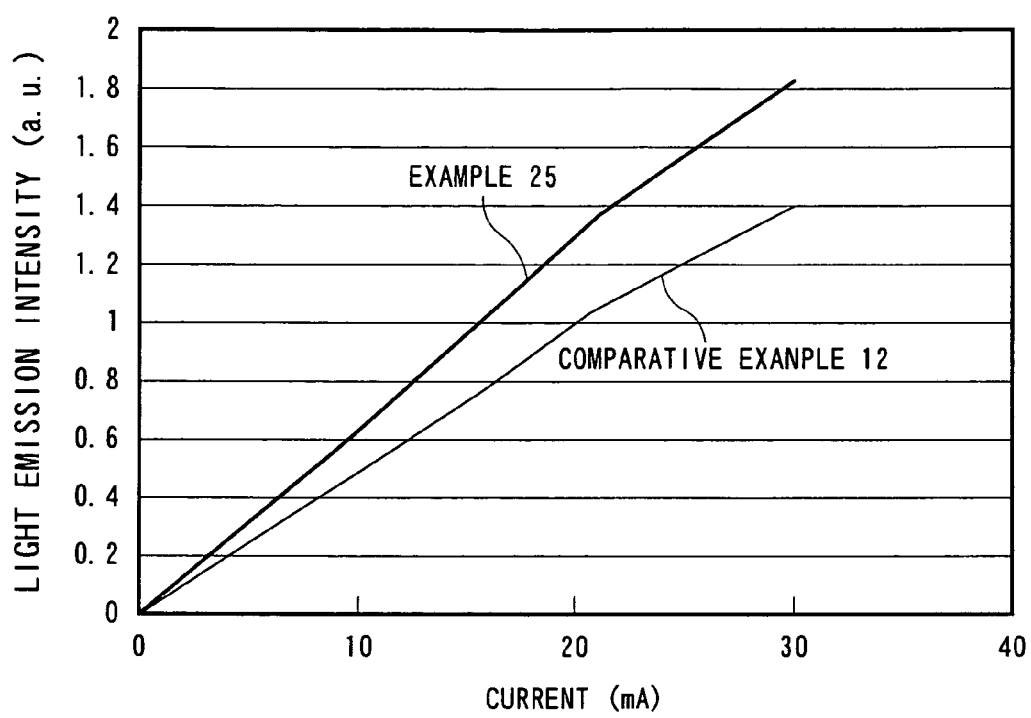
FIG. 7 is a graph showing the relationship between the current and the light emission intensity of the light emitting apparatuses shown in FIGS. 5 and 6.
Figure 8A:
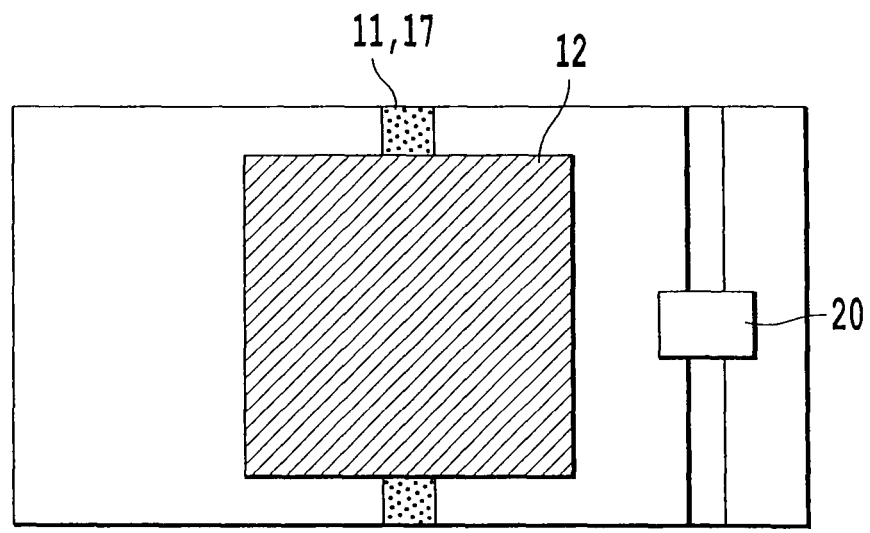
FIGS. 8A and 8B are a plan view and a sectional view, respectively, of an example of the configurations of light emitting apparatuses having a resist film and a peripheral component.
Figure 8B:
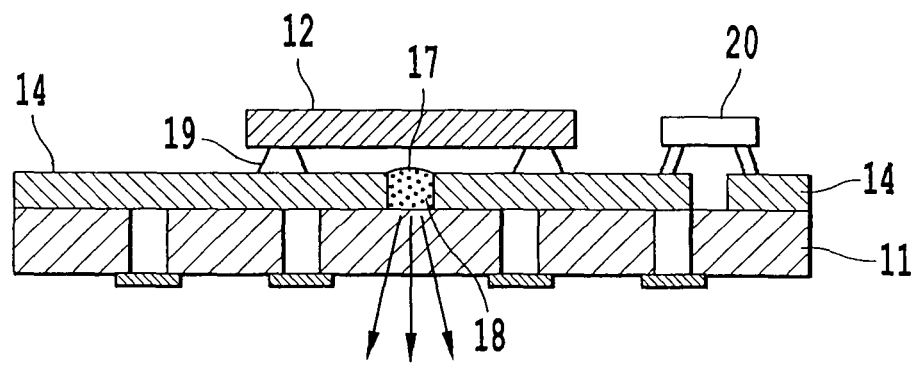

The results shown in FIG. 7 clearly verify that, in the light emitting apparatus according to EXAMPLE 25 having the white resist film 18 formed in the gap 17 between the vapor-deposited metal films 14 and 14, light dissipation toward the rear surface of the AlN substrate is effectively prevented due to the reflecting and masking (shielding) effects of the white resist film 18, and that the light emitting apparatus can have an increased emission intensity within the rated current range at about 28% to 32% higher than the emission intensity of COMPARATIVE EXAMPLE 12.

In contrast, the light emitting apparatus according to COMPARATIVE EXAMPLE 12 having no white resist film has a relatively lower luminance, since the light emitted from the LED chip 12 dissipates from the gap 17 toward the rear surface of the AlN substrate 11 as indicated by the arrows in FIG. 6B.

Similar to FIGS. 5A and 5B, FIGS. 8A and 8B show the solder resist ink 18 injected into the gap 17 formed between the adjacent vapor-deposited metal films 14 and 14. More specifically, the solder resist ink 18 is injected into a portion where the vapor-deposited metal film 14 is not formed. In such a light emitting apparatus having the solder resist ink 18 in the gap 17, dissipation of light toward the rear surface of the AlN substrate is effectively prevented due to the reflecting and masking effects of the resist film. Additionally, a peripheral component 20 is shown and is selected from the group consisting of diodes for inhibiting reverse current, resistances, and thermistors.

INDUSTRIAL APPLICABILITY

Since the light emitting apparatuses according to the above-mentioned configuration use an aluminum nitride (AlN) co-fired substrate having a high thermal conductivity as a substrate (LED package) for mounting a LED chip, they have significantly increased heat radiation performance and increased critical currents, thereby allow a large current to pass therethrough, and can have significantly increased luminance.

Since the surface of the substrate bearing the light emitting device is mirror-polished, the reflectivity at the polished surface increases, and light emitted from the joint surface of the light emitting device can be effectively reflected toward the front surface of the substrate. Thus, the emission intensity (luminance) can be substantially increased.

Additionally, since a vapor-deposited metal film having a reflectivity of 90% or more with respect to light emitted from the light emitting device is arranged on a surface of the aluminum nitride substrate around the light emitting device, the reflection intensity of light can be increased.

Since via holes are arranged so as to penetrate the aluminum nitride substrate from the front surface bearing the light emitting device to the rear surface thereof to thereby allow conduction to the light emitting device from the rear surface, the current is allowed to pass from the rear surface of the aluminum nitride substrate via the via holes to the light emitting device on the front surface. This structure eliminates the necessity of connection of interconnections on the front surface of the substrate by a wire bonding process, simplifies the interconnection structure, avoids the protrusion of bonding wires in a thickness direction, and can reduce the light emitting apparatus in thickness and size.

Since via holes are arranged so as to penetrate the aluminum nitride substrate from the front surface to the rear surface thereof to thereby allow conduction to the light emitting device from the rear surface, the light emitting device can be mounted to the aluminum nitride substrate by a flip chip assembly technique in accordance with a face down system. The interconnection structure according to the face down system enables the electrodes to be taken out at arbitrary positions of the surface of the light emitting device. This structure allows the connection between the light emitting device and the interconnection conductor at a shortest distance, inhibits the LED chip as the light emitting device from increasing in size even if provided with an increased number of electrodes, and enables the mounting of the LED chip in a vary small thickness.

The optical reflection intensity can further be increased by arranging a white resist film on an exposed surface of the aluminum nitride substrate, such as regions between conductive layer trances, other than the region where the vapor-deposited metal film is arranged.

The invention claimed is:

1. A white-light emitting apparatus comprising: a co-fired aluminum nitride substrate; and a light emitting device arranged on a front surface of the co-fired aluminum nitride substrate,
    wherein the front surface of the co-fired aluminum nitride substrate, on which the light emitting device is arranged, is mirror-polished so as to have a surface roughness of 0.3 µm Ra or less,
    wherein the light emitting apparatus comprises a vapor-deposited metal film and via holes, the vapor-deposited metal film being arranged directly on the front surface of the co-fired aluminum nitride substrate around the light emitting device and having a reflectivity of 90% or more with respect to light emitted from the light emitting device, and the via holes penetrating the co-fired aluminum nitride substrate from the front surface, on which the light emitting device is arranged, to the rear surface of the co-fired aluminum nitride substrate to thereby allow an electrical conduction to the light emitting device from the rear surface to the front surface without using a wire-bonding,
    wherein the vapor-deposited metal film comprises aluminum or silver and has a thickness of 1 to 5 µm, and
    wherein the co-fired aluminum nitride substrate has a thickness of 0.3 to 0.6 mm.

2. The light emitting apparatus according to claim 1, comprising a LED chip as the light emitting device and further comprising at least one peripheral component arranged on the co-fired aluminum nitride substrate, wherein the at least one peripheral component is selected from the group consisting of a thermistor, a resistor, and a diode for inhibiting reverse current.

3. The light emitting apparatus according to claim 1, wherein the co-fired aluminum nitride substrate carrying the light emitting device has a surface roughness of 0.1 µm Ra or less.

4. The light emitting apparatus according to claim 1, wherein the light emitting device is mounted on the co-fired aluminum nitride substrate through a metal bump.

5. The light emitting apparatus according to claim 1, wherein a white resist film is arranged on an exposed front surface of the co-fired aluminum nitride substrate other than a region where the vapor-deposited metal film is arranged.

6. The light emitting apparatus according to claim 5, wherein the white resist film comprises a solder resist ink and is formed by screen printing method.

7. The light emitting apparatus according to claim 1, wherein the vapor-deposited metal film is deposited via a chemical vapor deposition method or a sputtering method.

8. The light emitting apparatus according to claim 1, wherein a maximum current quantity applicable to said apparatus is 1100 to 2000 mA.

9. The light emitting apparatus according to claim 1, comprising a blue LED chip as the light emitting device and a yellow phosphor, wherein said blue LED chip is mounted on the co-fired aluminum nitride substrate and said yellow phosphor is mounted so as to cover the mounted blue LED chip.

* * * * *